(12) United States Patent
Choi et al.

(10) Patent No.: US 12,424,489 B2
(45) Date of Patent: Sep. 23, 2025

(54) SEMICONDUCTOR DEVICE INCLUDING MULTI-CAPPING LAYER AND METHOD FOR MANUFACTURING THE SAME

(71) Applicant: Samsung Electronics Co., Ltd., Suwon-si (KR)

(72) Inventors: Minjung Choi, Suwon-si (KR); Jongmin Lee, Hwaseong-si (KR); Jimin Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 504 days.

(21) Appl. No.: 17/662,301

(22) Filed: May 6, 2022

(65) Prior Publication Data
US 2023/0080862 A1    Mar. 16, 2023

(30) Foreign Application Priority Data

Sep. 16, 2021    (KR) .......................... 10-2021-0123778

(51) Int. Cl.
*H01L 21/768*    (2006.01)
*H01L 23/48*    (2006.01)
*H01L 23/522*    (2006.01)
*H01L 23/532*    (2006.01)

(52) U.S. Cl.
CPC .. *H01L 21/76832* (2013.01); *H01L 21/76802* (2013.01); *H01L 21/76898* (2013.01); *H01L 23/5226* (2013.01); *H01L 23/5329* (2013.01); *H01L 21/76834* (2013.01)

(58) Field of Classification Search
CPC ......... H01L 21/76832; H01L 21/76802; H01L 21/76898; H01L 23/5226; H01L 23/5329; H01L 21/76834; H01L 23/481; H01L 23/53295
See application file for complete search history.

(56) References Cited

U.S. PATENT DOCUMENTS

| | | | |
|---|---|---|---|
| 7,119,441 B2 | 10/2006 | Ohto et al. |
| 7,531,901 B2 | 5/2009 | Lee |
| 9,570,377 B2 | 2/2017 | Jin et al. |
| 10,229,876 B2 | 3/2019 | Kim et al. |

(Continued)

FOREIGN PATENT DOCUMENTS

| | | |
|---|---|---|
| KR | 20070071152 A | 7/2007 |
| KR | 100937953 B1 | 1/2010 |

(Continued)

*Primary Examiner* — Joshua Benitez Rosario
*Assistant Examiner* — Moataz Khalifa
(74) *Attorney, Agent, or Firm* — Wolf, Greenfield & Sacks, P.C.

(57) ABSTRACT

A semiconductor device according to the disclosure includes a substrate, a transistor connected to the substrate, and a wiring structure including contact wirings electrically connected to the transistor. The wiring structure further includes a first wiring insulating layer, a first material layer contacting the first wiring insulating layer, a second material layer contacting the first material layer, and a second wiring insulating layer contacting the second material layer. The first material layer includes SiN, and the second material layer includes SiCN. A dielectric constant of the first wiring insulating layer is greater than a dielectric constant of the second wiring insulating layer.

20 Claims, 11 Drawing Sheets

(56) References Cited

U.S. PATENT DOCUMENTS

| | | | |
|---|---|---|---|
| 10,510,732 B2 | 12/2019 | Tsou et al. | |
| 2010/0059887 A1* | 3/2010 | Ueki | H01L 23/5329 257/784 |
| 2010/0102454 A1 | 4/2010 | Akiyama | |
| 2011/0254165 A1* | 10/2011 | Muranaka | H01L 23/53295 257/E23.161 |
| 2014/0252636 A1* | 9/2014 | Chen | H01L 21/76829 257/773 |
| 2020/0035605 A1* | 1/2020 | Tsai | H01L 23/5226 |

FOREIGN PATENT DOCUMENTS

| | | |
|---|---|---|
| KR | 100953742 B1 | 4/2010 |
| KR | 20160136062 A | 11/2016 |

\* cited by examiner

SEMICONDUCTOR DEVICE INCLUDING MULTI-CAPPING LAYER AND METHOD FOR MANUFACTURING THE SAME

CROSS-REFERENCE TO THE RELATED APPLICATION

This application claims priority from Korean Patent Application No. 10-2021-0123778, filed on Sep. 16, 2021 in the Korean Intellectual Property Office, the disclosure of which is incorporated herein by reference in its entirety.

BACKGROUND

1. Field

The example embodiments of the disclosure relate to a semiconductor device and a method for manufacturing the same. More particularly, the example embodiments of the disclosure relate to a semiconductor device including a multi-capping layer and a method for manufacturing the same.

2. Description of the Related Art

Semiconductor devices are being highlighted in electronics industries in accordance with characteristics thereof, such as miniaturization, multifunctionalization, low manufacturing costs, etc. Semiconductor devices may be classified into various categories including, but not limited to, semiconductor memory devices to store logic data, semiconductor logic devices to arithmetically process logic data, hybrid semiconductor devices including a memory element and a logic element, etc. In accordance with advances in electronics industries, demand semiconductor devices having particular characteristics is gradually increasing. For example, demand for high reliability, high speed, multifunctionalization, etc. of semiconductor devices is gradually increasing. To provide semiconductor devices that include such characteristics, structures in semiconductor devices have generally become more and more complicated. In addition, semiconductor devices have generally become more and more highly integrated.

SUMMARY

The example embodiments of the disclosure may provide a semiconductor device having enhanced reliability.

A semiconductor device according to some example embodiments of the disclosure may include a substrate, a transistor connected to the substrate, and a wiring structure including contact wirings electrically connected to the transistor. The wiring structure may further include a first wiring insulating layer, a first material layer contacting the first wiring insulating layer, a second material layer contacting the first material layer, and a second wiring insulating layer contacting the second material layer. The first material layer may include SiN, and the second material layer may include SiCN. A dielectric constant of the first wiring insulating layer may be greater than a dielectric constant of the second wiring insulating layer.

A semiconductor device according to some example embodiments of the disclosure may include a substrate, an insulating layer on the substrate, a transistor between the substrate and the insulating layer, and a wiring structure covering the insulating layer. The wiring structure may include a first wiring insulating layer, a first material layer contacting the first wiring insulating layer, a second material layer contacting the first material layer, and a second wiring insulating layer contacting the second material layer. The first material layer may include SiN, the second material layer may include SiCN, and the first and second wiring insulating layers may include an insulating material including carbon and oxygen. A carbon concentration of the first wiring insulating layer may be less than a carbon concentration of the second wiring insulating layer.

A semiconductor device according to some example embodiments of the disclosure may include a substrate, an insulating layer on the substrate, a transistor between the substrate and the insulating layer, and a wiring structure on the insulating layer. The wiring structure may include a first wiring and a second wiring contacting each other, a first wiring insulating layer at least partially surrounding the first wiring in a plan view of the semiconductor device, a second wiring insulating layer at least partially surrounding the second wiring in a plan view of the semiconductor device, and a multi-capping layer interposed between the first and second wiring insulating layers. A dielectric constant of the first wiring insulating layer may be greater than a dielectric constant of the second wiring insulating layer. The multi-capping layer may include a first material layer and a second material layer respectively having different carbon concentrations.

DETAILED DESCRIPTION OF EXAMPLE EMBODIMENTS

Figure 1:
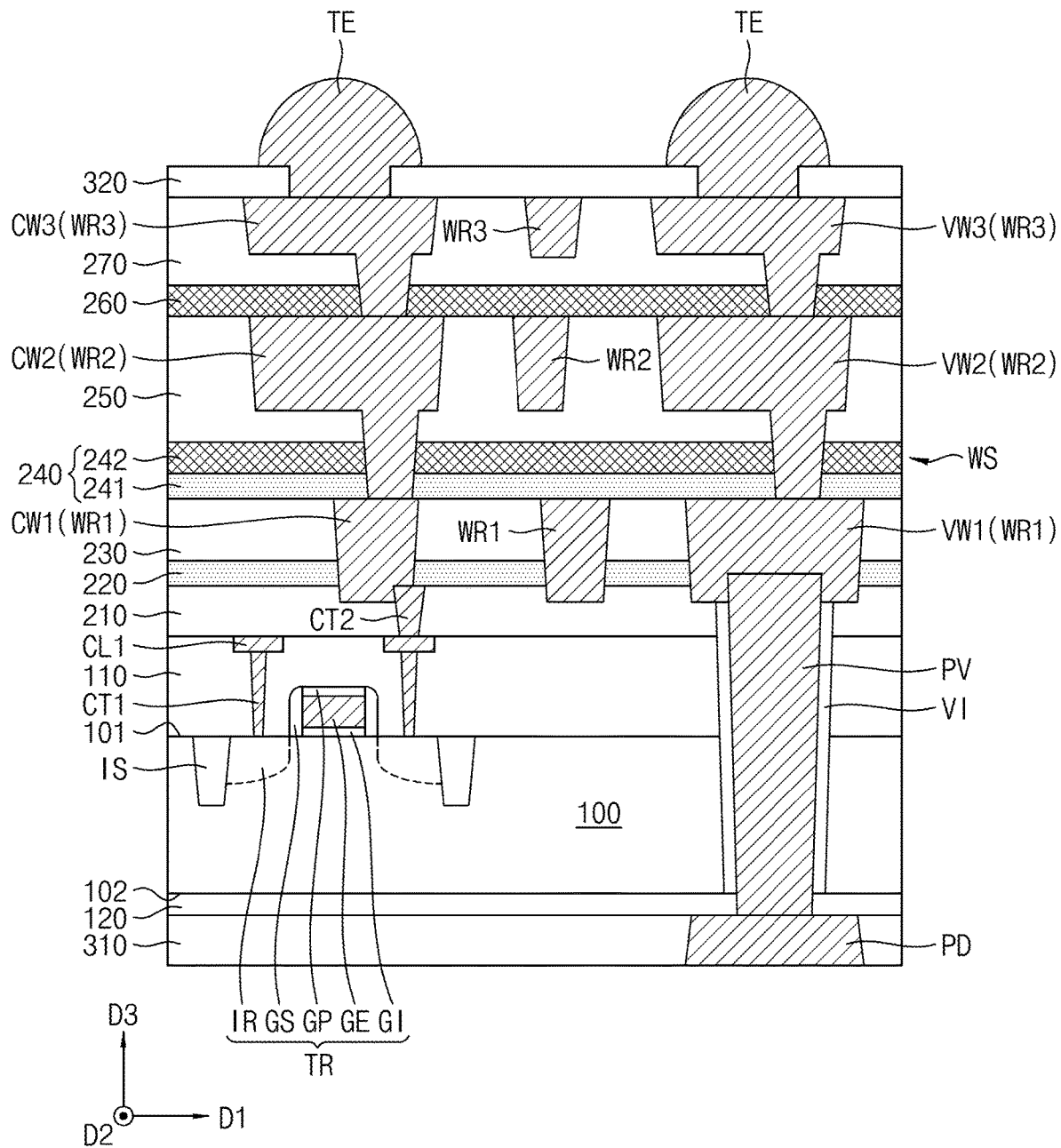
FIG. 1 is a sectional view of a semiconductor device according to some example embodiments of the disclosure.

FIG. 1 is a sectional view of a semiconductor device according to some example embodiments of the disclosure. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Referring to FIG. 1, a semiconductor device may include a substrate 100. The substrate 100 may have the form of a plate extending along a plane defined by a first direction D1 and a second direction D2. The first direction D1 and the second direction D2 may intersect each other. For example, the first direction D1 and the second direction D2 may perpendicularly intersect each other. In some embodiments, the substrate 100 may be a semiconductor substrate. For example, the substrate 100 may include, but is not limited to, silicon, germanium, silicon-germanium, GaP, or GaAs.

The substrate 100 may include a first surface 101 and a second surface 102 opposing each other. The first surface 101 may be an active surface of the substrate 100. In the cross according to FIG. 1, the first surface 101 may be a top surface of the substrate 100, and the second surface 102 may be a bottom surface of the substrate 100.

A first insulating layer 110 on and at least partially covering the first surface 101 of the substrate 100 may be provided. A bottom surface of the first insulating layer 110 may physically contact the first surface 101 of the substrate 100. The first insulating layer 110 may include an insulating material. In some embodiments, the first insulating layer 110 may be a multi-insulating layer.

A second insulating layer 120 on and at least partially covering the second surface 102 of the substrate 100 may be provided. A top surface of the second insulating layer 120 may physically contact the second surface 102 of the substrate 100. The second insulating layer 120 may include an insulating material. In some embodiments, the second insulating layer 120 may be a multi-insulating layer.

A transistor TR may be provided between the substrate 100 and the first insulating layer 110. For example, the transistor TR may be a cell transistor or a peripheral transistor which constitutes a memory device, a logic device, or an image sensor device. The first insulating layer 110 may be on and at least partially over the transistor TR. The transistor TR may be disposed on the first surface 101 of the substrate 100. The transistor TR may be connected to the substrate 100.

The transistor TR may include impurity regions IR, and a channel and a gate structure, which are disposed between the impurity regions IR. The gate structure may include gate spacers GS, and a gate insulating layer GI, a gate electrode GE, and a gate capping layer GP, which are disposed between the gate spacers GS. The impurity regions IR may be formed through implantation of an impurity in the substrate 100. The gate spacers GS, the gate insulating layer IG, and the gate capping layer GP may include an insulating material. The gate electrode GE may include a conductive material. The structure of the transistor TR is not limited to that shown and described in FIG. 1. In some embodiments, the transistor may include a buried gate electrode. In some embodiments, the transistor may include a vertical gate electrode. In some embodiments, the transistor may include a gate all around structure.

Element isolation layers IS may be provided in the substrate 100. The transistor TR may be disposed between the element isolation layers IS. The element isolation layers IS may define an active region of the substrate 100. The element isolation layers IS may include an insulating material.

First contacts CT1 and first conductive lines CL1 may be provided in the first insulating layer 110. The first contact CT1 may physically contact the transistor TR, and the first conductive line CL1 may physically contact the first contact CT1. The first contacts CT1 and the first conductive lines CL1 may include a conductive material. The number of the first contacts CT1 and the number of the first conductive lines CL1 are not limited to the shown conditions, and the contacts and the conductive lines provided in the first insulating layer 110 may be defined as a first contact and a first conductive line, respectively.

A penetrating via PV, which extends through the substrate 100, the first insulating layer 110 and the second insulating layer 120, may be provided. The penetrating via PV may extend through the first surface 101 and the second surface 102 of the substrate 100. A bottom surface of the penetrating via PV may be coplanar with a bottom surface of the second insulating layer 120. The penetrating via PV may extend in a third direction D3. The third direction D3 may intersect the first direction D1 and the second direction D2. For example, the third direction D3 may perpendicularly intersect the first direction D1 and the second direction D2. In other words, the first direction D1, the second direction D2, and the third direction D3 may all be perpendicular to each other in three-dimensional space. The width of the penetrating via PV in the first direction D1 may gradually increase as the penetrating via PV extends toward a wiring structure WS, which will be described below.

In some embodiments, the penetrating via PV may include a conductive layer and a barrier layer. The conductive layer of the penetrating via PV may include, for example, copper, aluminum, and/or tungsten, the barrier layer of the penetrating via PV may include, for example, titanium and/or tantalum.

A via insulating layer VI surrounding an outer side wall of the penetrating via PV, in a plan view of the semiconductor device, may be provided. It will be understood that "an element A surrounds an element B" (or similar language) as used herein means that the element A is at least partially around the element B or that element B is at least partially bounded by element A but does not necessarily mean that the element A completely encloses the element B. An inner side wall of the via insulating layer VI may physically contact the outer side wall of the penetrating via PV. The via insulating layer VI may extend through the first insulating layer 110 and the substrate 100. The penetrating via PV may be spaced apart from the first insulating layer 110 and the substrate 100 by the via insulating layer VI. The via insulating layer VI may be interposed between the penetrating via PV and the first insulating layer 110 and between the penetrating via PV and the substrate 100. A bottom surface of the via insulating layer VI may physically contact a top surface of the second insulating layer 120. The via insulating layer VI may include an insulating material. For example, the via insulating layer VI may include an oxide.

The wiring structure WS, which is on and at least partially covers the first insulating layer 110, may be provided. A bottom surface of the wiring structure WS may physically contact a top surface of the first insulating layer 110. The first insulating layer 110 may be provided between the wiring structure WS and the substrate 100. The transistor TR may be provided between the wiring structure WS and the substrate 100. The wiring structure WS may be connected to the penetrating via PV and the via insulating layer VI.

The wiring structure WS may include a first wiring insulating layer 210, a first single capping layer 220, a second wiring insulating layer 230, a multi-capping layer 240, a third wiring insulating layer 250, a second single capping layer 260, and a fourth wiring insulating layer 270, which are sequentially provided in the third direction D3. Each of the first wiring insulating layer 210, the first single capping layer 220, the second wiring insulating layer 230, the multi-capping layer 240, the third wiring insulating layer 250, the second single capping layer 260, and the fourth wiring insulating layer 270 may be parallel to the substrate 100. Each of the first wiring insulating layer 210, the first single capping layer 220, the second wiring insulating layer 230, the multi-capping layer 240, the third wiring insulating layer 250, the second single capping layer 260, and the fourth wiring insulating layer 270 may have the form of a plate extending along a plane defined by the first direction D1 and the second direction D2.

The first wiring insulating layer 210 may be on and at least partially cover the first insulating layer 110. A bottom surface of the first wiring insulating layer 210 may physically contact the top surface of the first insulating layer 110. The first wiring insulating layer 210 may include an insulating material including oxygen and carbon. For example, the first wiring insulating layer 210 may include tetraethyl orthosilicate (TEOS).

The first single capping layer 220 may be on and at least partially cover the first wiring insulating layer 210. A bottom surface of the first single capping layer 220 may physically contact a top surface of the first wiring insulating layer 210. The first single capping layer 220 may include an insulating material including nitrogen. For example, the first single capping layer 220 may include SiN.

The second wiring insulating layer 230 may be on and at least partially cover the first single capping layer 220. A bottom surface of the second wiring insulating layer 230 may physically contact a top surface of the first single capping layer 220. The first single capping layer 220 may be interposed between the second wiring insulating layer 230 and the first wiring insulating layer 210. The second wiring insulating layer 230 may include the same material as the first wiring insulating layer 210. The second wiring insulating layer 230 may include an insulating material including oxygen and/or carbon. For example, the second wiring insulating layer 230 may include TEOS.

The multi-capping layer 240 may be on and at least partially cover the second wiring insulating layer 230. A bottom surface of the multi-capping layer 240 may contact a top surface of the second wiring insulating layer 230. The multi-capping layer 240 may include a first material layer 241 and a second material layer 242, which are sequentially stacked in the third direction D3.

The first material layer 241 may be on and at least partially cover the second wiring insulating layer 230. A bottom surface of the first material layer 241 may physically contact a top surface of the second wiring insulating layer 230. The first material layer 241 may include the same material as the first single capping layer 220. The first material layer 241 may include an insulating material including nitrogen. For example, the first material layer 241 may include SiN.

The second material layer 242 may be on and at least partially cover the first material layer 241. A bottom surface of the second material layer 242 may physically contact a top surface of the first material layer 241. The second material layer 242 may include a material different from those of the first material layer 241 and the first single capping layer 220. The carbon concentration of the second material layer 242 may be different from the carbon concentration of the first material layer 241. The carbon concentration of the second material layer 242 may be greater than the carbon concentration of the first material layer 241. The second material layer 242 may include an insulating material including nitrogen and carbon. For example, the second material layer 242 may include SiCN.

The third wiring insulating layer 250 may be on and at least partially cover the second material layer 242 of the multi-capping layer 240. A bottom surface of the third wiring insulating layer 250 may physically contact a top surface of the second material layer 242 of the multi-capping layer 240. The multi-capping layer 240 may be interposed between the second and third wiring insulating layers 230 and 250. The third wiring insulating layer 250 may include a material different from those of the first and second wiring insulating layers 210 and 230. The dielectric constant of the third wiring insulating layer 250 may be less than the dielectric constants of the first and second wiring insulting layers 210 and 230. The third wiring insulating layer 250 may include a low dielectric material. The carbon concentration of the third wiring insulating layer 250 may be greater than the carbon concentration of each of the first and second wiring insulating layers 210 and 230. The third wiring insulating layer 250 may include an insulating material including oxygen and/or carbon. For example, the third wiring insulating layer 250 may include porous SiOCH.

The second single capping layer 260 may be on and at least partially cover the third wiring insulating layer 250. A bottom surface of the single capping layer 260 may physically contact a top surface of the third wiring insulating layer 250. The second single capping layer 260 may include the same material as the second material layer 242 of the multi-capping layer 240. The second single capping layer 260 may include an insulating material including nitrogen and/or carbon. For example, the second single capping layer 260 may include SiCN.

The fourth wiring insulating layer 270 may be on and substantially cover the second single capping layer 260. A bottom surface of the fourth wiring insulating layer 270 may physically contact a top surface of the second single capping layer 260. The second single capping layer 260 may be interposed between the third and fourth wiring insulating layers 250 and 270. The fourth wiring insulating layer 270 may include the same material as the third wiring insulating layer 250. The fourth wiring insulating layer 270 may include a material different from those of the first and second wiring insulating layers 210 and 230. The dielectric constant of the fourth wiring insulating layer 270 may be less than the dielectric constants of the first and second wiring insulating layers 210 and 230. The fourth wiring insulating layer 270 may include a low dielectric material. The carbon concentration of the fourth wiring insulating layer 270 may be greater than the carbon concentration of each of the first and second wiring insulating layers 210 and 230. The fourth wiring insulating layer 270 may include an insulating material including oxygen and/or carbon. For example, the fourth wiring insulating layer 270 may include porous SiOCH.

The wiring structure WS may further include a second contact CT2, first wirings WR1, second wirings WR2, and third wirings WR3.

The second contact CT2 may be provided in the first wiring insulating layer 210. The second contact CT2 may be at least partially surrounded in a plan view of the semiconductor device by the first wiring insulating layer 210. The bottom surface of the first single capping layer 220 may physically contact a top surface of the second contact CT2. The second contact CT2 may physically contact the first conductive line CL1.

The first wirings WR1 may be provided in a structure in which the first wiring insulating layer 210, the first single capping layer 220, and the second wiring insulating layer 230 are coupled. The first wirings WR1 may be disposed at the same level in the cross-sectional view of FIG. 1, i.e., with a top surface of the substrate 100 being a base reference level. Each of the first wiring insulating layer 210, the first single capping layer 220, and the second wiring insulating layer 230 may at least partially surround, in a plan view of the semiconductor device, each of the first wirings WR1. The first wirings WR1 may extend through the second wiring insulating layer 230 and the first single capping layer 220. A lowermost portion of each of the first wirings WR1 may be provided in the first wiring insulating layer 210. Top surfaces of the first wirings WR1 may physically contact the bottom surface of the first material layer 241 of the multi-capping layer 240. The top surfaces of the first wirings WR1 may be coplanar with the top surface of the second wiring insulating layer 230.

The first wirings WR1 may include a first via wiring VW1 contacting the penetrating via PV. The first wirings WR1 may include a first contact wiring CW1 physically contacting the second contact CT2.

The second wirings WR2 may be provided in a structure in which the multi-capping layer 240 and the third wiring insulating layer 250 are coupled. The second wirings WR2 may be disposed at the same level in the cross-sectional view of FIG. 1, i.e., with a top surface of the substrate 100 being a base reference level. Each of the multi-capping layer 240 and the third wiring insulating layer 250 may at least partially surround, in a plan view of the semiconductor device, each of the second wirings WR2. At least a part of the second wirings WR2 may include a wiring portion and a via portion. The wiring portion of the second wiring WR2 may be a portion disposed in the third wiring insulating layer 250, and the via portion of the second wiring WR2 may be a portion extending through the multi-capping layer 240. Top surfaces of the second wirings WR2 may physically contact a bottom surface of the second single capping layer 260. The top surfaces of the second wirings WR2 may be coplanar with the top surface of the third wiring insulating layer 250.

The second wirings WR2 may include a second via wiring VW2 physically contacting the first via wiring VW1. The second wirings WR2 may include a second contact wiring CW2 physically contacting the first contact wiring CW1.

The third wirings WR3 may be provided in a structure in which the second single capping layer 260 and the fourth wiring insulating layer 270 are coupled. The third wirings WR3 may be disposed at the same level in the cross-sectional view of FIG. 1, i.e., with a top surface of the substrate 100 being a base reference level. Each of the second single capping layer 260 and the fourth wiring insulating layer 270 may at least partially surround each of the third wirings WR3 in a plan view of the semiconductor device. At least a part of the third wirings WR3 may include a wiring portion and a via portion. The wiring portion of the third wiring WR3 may be a portion disposed in the fourth wiring insulating layer 270, and the via portion of the third wiring WR3 may be a portion extending through the second single capping layer 260. Top surfaces of the third wirings WR3 may be coplanar with a top surface of the fourth wiring insulating layer 270.

The third wirings WR3 may include a third via wiring VW3 physically contacting the second via wiring VW2. The third wirings WR3 may include a third contact wiring CW3 physically contacting the second contact wiring CW2.

The third via wiring VW3, the second via wiring VW2, and the first via wiring VW1 may be electrically connected to the penetrating via PV. The third contact wiring CW3, the second contact wiring CW2, the first contact wiring CW1, the second contact CT2, the first conductive line CL1, and the first contact CT1 may be electrically connected to the transistor TR.

In some embodiments, each of the first to third wirings WR1, WR2 and WR3 may include a conductive layer and a barrier layer. The conductive layer of each of the first to third wirings WR1, WR2 and WR3 may include, for example, copper, aluminum, and/or tungsten, and the barrier layer of each of the first to third wirings WR1, WR2 and WR3 may include, for example, titanium and/or tantalum.

The number of the wiring insulating layers 210, 230, 250, and 270 is not limited to the example number illustrated and described with reference to FIG. 1. In some embodiments, the number of wiring insulating layers may be three or less, or five or less. In some embodiments, the number of single and multi-capping layers and the number of wirings may correspond to the number of wiring insulating layers.

In some embodiments, a first wiring insulating layer, a first single capping layer, a second wiring insulating layer, a first multi-capping layer, a third wiring insulating layer, a second multi-capping layer, a fourth wiring insulating layer, a second single capping layer, and a fifth wiring insulating layer may be sequentially stacked on a first insulating layer. In such embodiments, first wirings at least partially surrounded by the second wiring insulating layer in a plan view of the semiconductor device, second wirings at least partially surrounded by the third wiring insulating layer in a plan view of the semiconductor device, third wirings at least partially surrounded by the fourth wiring insulating layer in a plan view of the semiconductor device, and fourth wirings at least partially surrounded by the fifth wiring insulating layer in a plan view of the semiconductor device may be provided.

A first protective layer 310 on and at least partially covering the bottom surface of the second insulating layer 120 may be provided. A top surface of the first protective layer 310 may physically contact the bottom surface of the second insulating layer 120. The first protective layer 310 may include an insulating material.

A pad PD may be provided in the first protective layer 310. The pad PD may extend through the first protective layer 310. The pad PD may be connected to the penetrating via PV. A top surface of the pad PD may physically contact the bottom surface of the penetrating via PV. The pad PD may include a conductive material.

A second protective layer 320 at least partially covering the top surface of the fourth wiring insulating layer 270 may be provided. A bottom surface of the second protective layer 320 may physically contact the top surface of the fourth wiring insulating layer 270. The second protective layer 320 may include an insulating material.

Terminals TE extending through the second protective layer 320 may be provided. The terminals TE may physically contact the third wirings WR3. Bottom surfaces of the terminals TE may physically contact the top surfaces of the third wirings WR3, respectively. The terminals TE may include a conductive material.

In the semiconductor device according to the example embodiments of the disclosure, the multi-capping layer 240 may include the first material layer 241 and the second material layer 242, which include different materials, respectively. Accordingly, the wiring insulating layers physically contacting the multi-capping layer 240 may be relatively strongly bonded to the multi-capping layer 240 and, as such, reliability of the semiconductor device may be enhanced.

Figure 2:
FIG. 2 is a graph explaining effects of a semiconductor device according to some example embodiments of the disclosure.

FIG. 2 is a graph that illustrates effects of a semiconductor device according to some example embodiments of the disclosure.

Referring to FIG. 2, a TEOS layer and a SiN layer physically contacting each other, a TEOS layer and a SiCN layer physically contacting each other, a porous SiOCH layer and a SiN layer physically contacting each other, and a porous SiOCH layer and a SiCN layer physically contacting each other were formed. Interfacial fracture energies at a plurality of positions between the TEOS layer and the SiN layer were measured, interfacial fracture energies at a plurality of positions between the TEOS layer and the SiCN layer were measured, interfacial fracture energies at a plurality of positions between the porous SiOCH layer and the SiN layer were measured, and interfacial fracture energies at a plurality of positions between the porous SiOCH layer and the SiCN layer were measured. An average of interfacial fracture energies between the TEOS layer and the SiN layer was measured to be higher than an average of interfacial fracture energies between the TEOS layer and the SiCN layer, and an average of interfacial fracture energies between the porous SiOCH layer and the SiCN layer were measured to be higher than an average of interfacial fracture energies between the porous SiOCH layer and the SiN layer. Accordingly, the bonding force between the TEOS layer and the SiN layer may be greater than the bonding force between the TEOS layer and the SiCN layer, and the bonding force between the porous SiOCH layer and the SiCN layer may be greater than the bonding force between the porous SiOCH layer and the SiN layer.

In the semiconductor device according to the example embodiments of the disclosure, a phenomenon in which layers of the semiconductor device are peeled off may be mitigated or prevented by providing the SiN layer physically contacting the TEOS layer and the SiCN layer contacting the porous SiOCH layer.

FIGS. 3A, 3B, 3C, 3D, 3E and 3F are sectional views illustrating a method for manufacturing the semiconductor device according to FIG. 1 according to some embodiments of the disclosure.

Figure 3A:
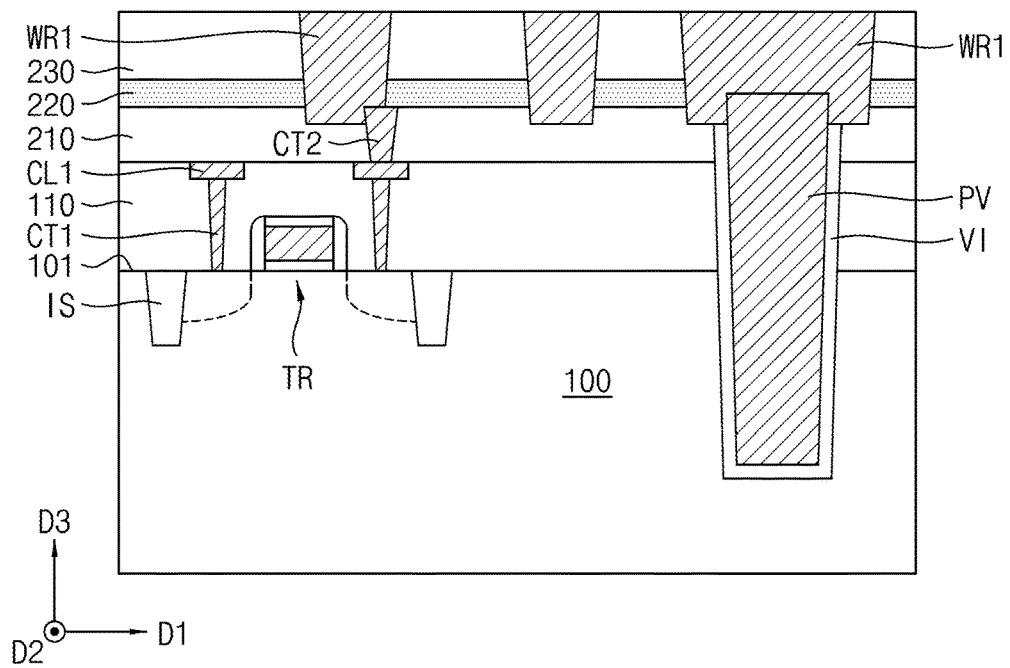
FIGS. 3A, 3B, 3C, 3D, 3E and 3F are sectional views illustrating a method for manufacturing the semiconductor device according to FIG. 1.

Referring to FIG. 3A, a transistor TR and an element isolation layer IS may be formed on a first surface 101 of a substrate 100. A first insulating layer 110 on the first surface 101 of the substrate 100, and first contacts CT1 and first conductive lines CL1 in the first insulating layer 110 may be formed. A first wiring insulating layer 210 may be formed on the first insulating layer 110. A second contact CT2 may be formed in the first wiring insulating layer 210. A first single capping layer 220 may be formed on the first wiring insulating layer 210.

A penetrating via PV and a via insulating layer VI may be formed. Formation of the penetrating via PV and the via insulating layer IV may include forming a hole extending through the first single capping layer 220, the first wiring insulating layer 210, the first insulating layer 110, and an upper portion of the substrate 100, forming a via insulating material layer and a penetrating via material layer, which is in and at least partially fills the hole, and removing upper portions of the via insulating material layer and the penetrating via material layer, thereby forming a via insulating layer VI and a penetrating via PV.

A second wiring insulating layer 230 may be formed on the first single capping layer 220. First wirings WR1 extending through the second wiring insulating layer 230 and the first single capping layer 220 may be formed.

Figure 3B:
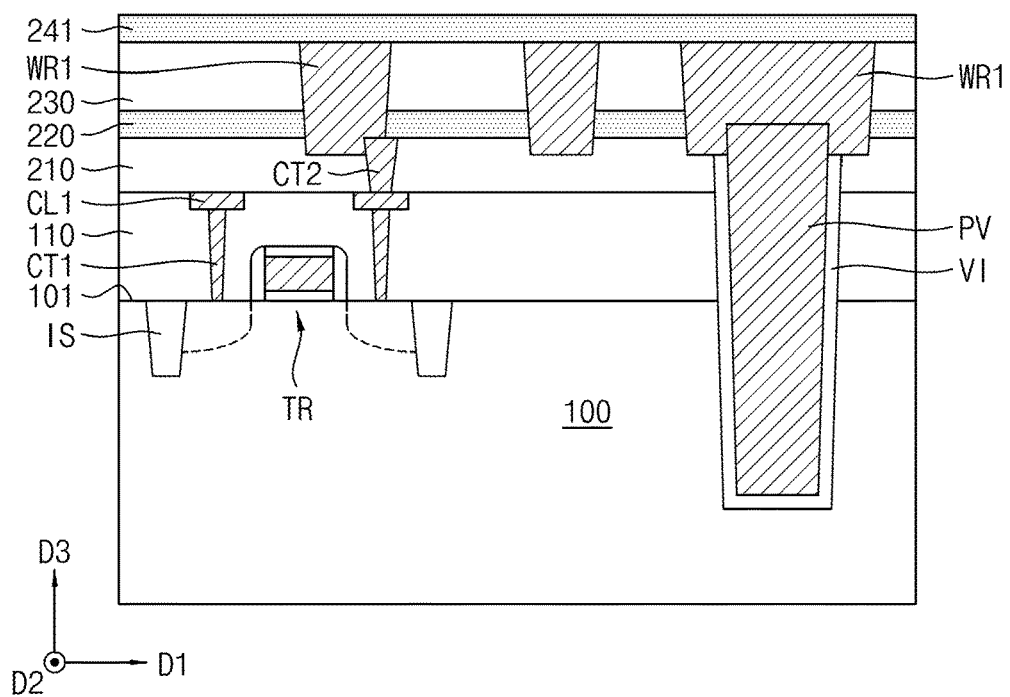

Referring to FIG. 3B, a first material layer 241 may be formed on the second wiring insulating layer 230. The first material layer 241 may be on and at least partially cover top surfaces of the first wirings WR1.

Figure 3C:
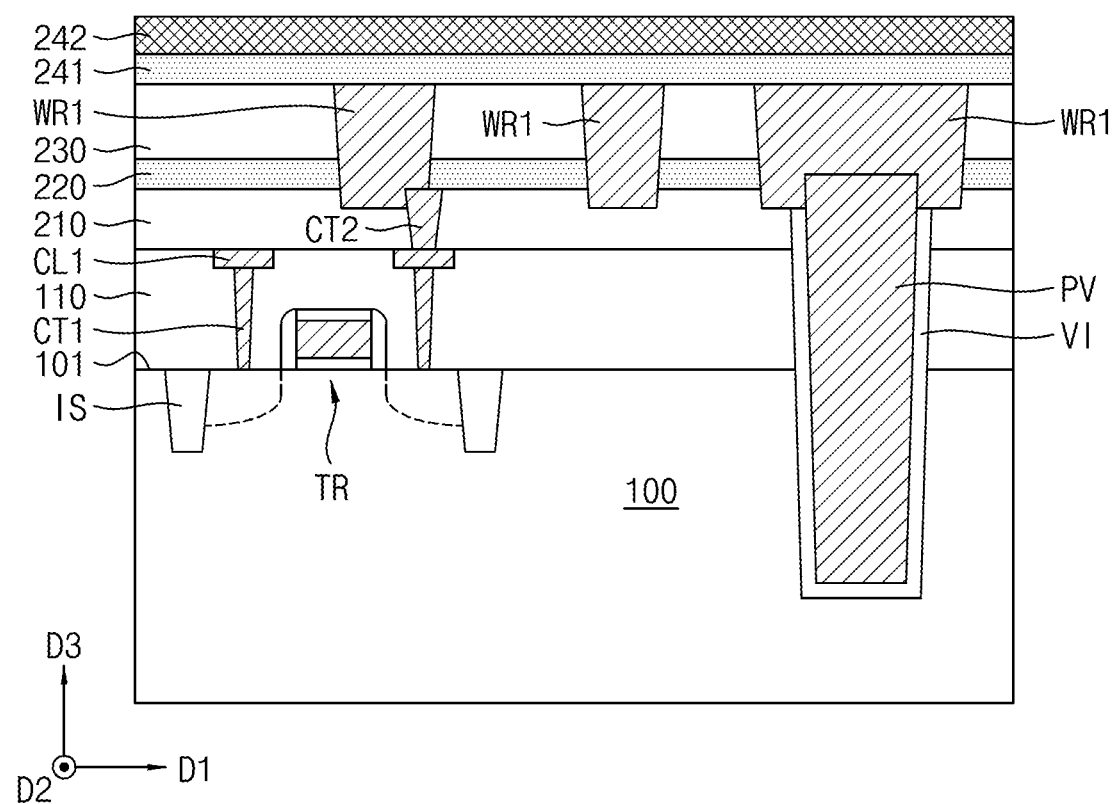

Referring to FIG. 3C, a second material layer 242 may be formed on the first material layer 241.

Figure 3D:
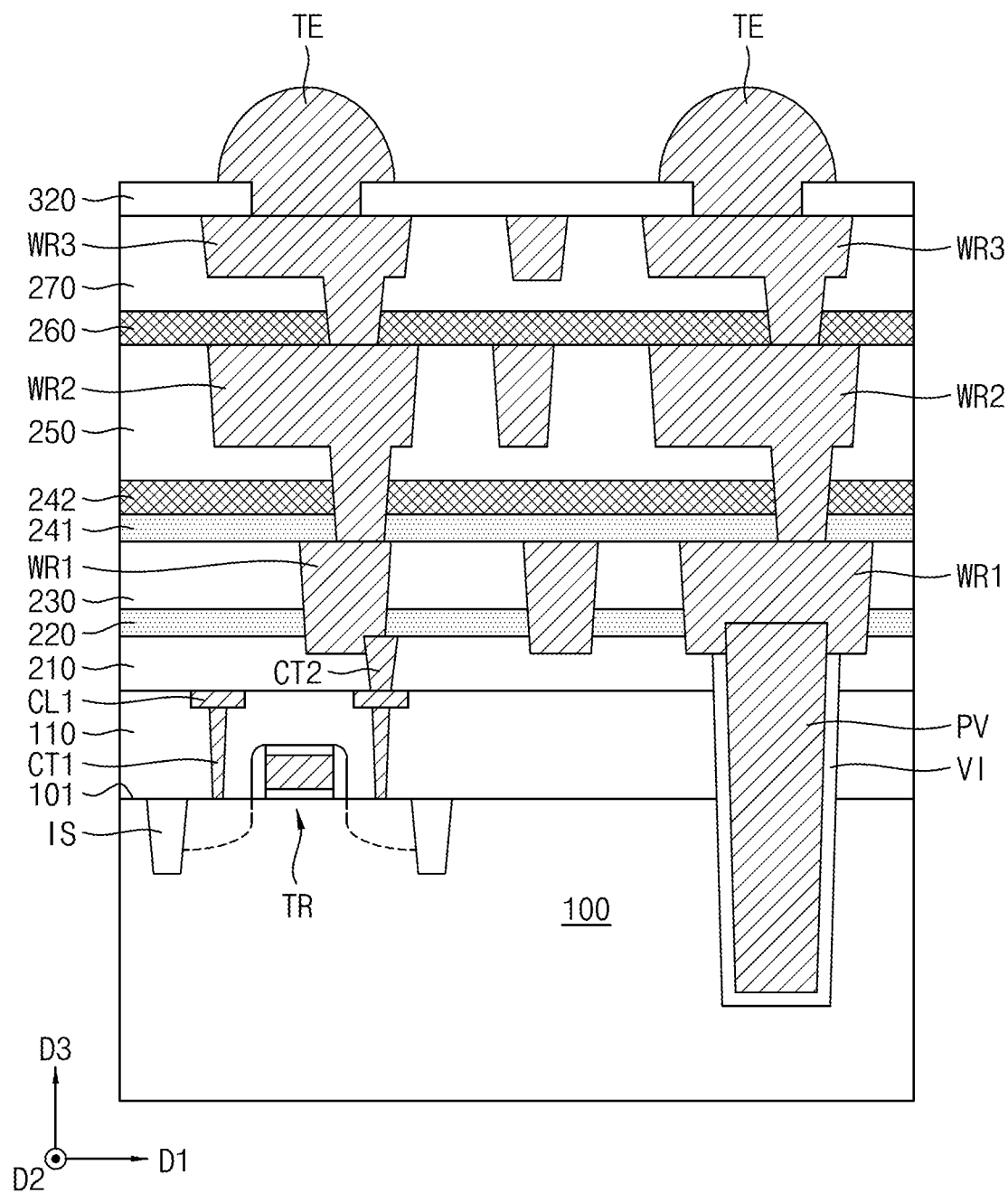

Referring to FIG. 3D, a third wiring insulating layer 250 may be formed on the second material layer 242. Second wirings WR2 extending through the third wiring insulating layer 250, the second material layer 242 and the first material layer 241 may be formed.

A second single capping layer 260 may be formed on the third wiring insulating layer 250, and a fourth wiring insulating layer 270 may be formed on the second single capping layer 260. Third wirings WR3 extending through the fourth wiring insulating layer 270 and the second single capping layer 260 may be formed.

A second protective layer 320 may be formed on the fourth wiring insulating layer 270. Terminals TE extending through the second protective layer 320 may be formed.

Figure 3E:
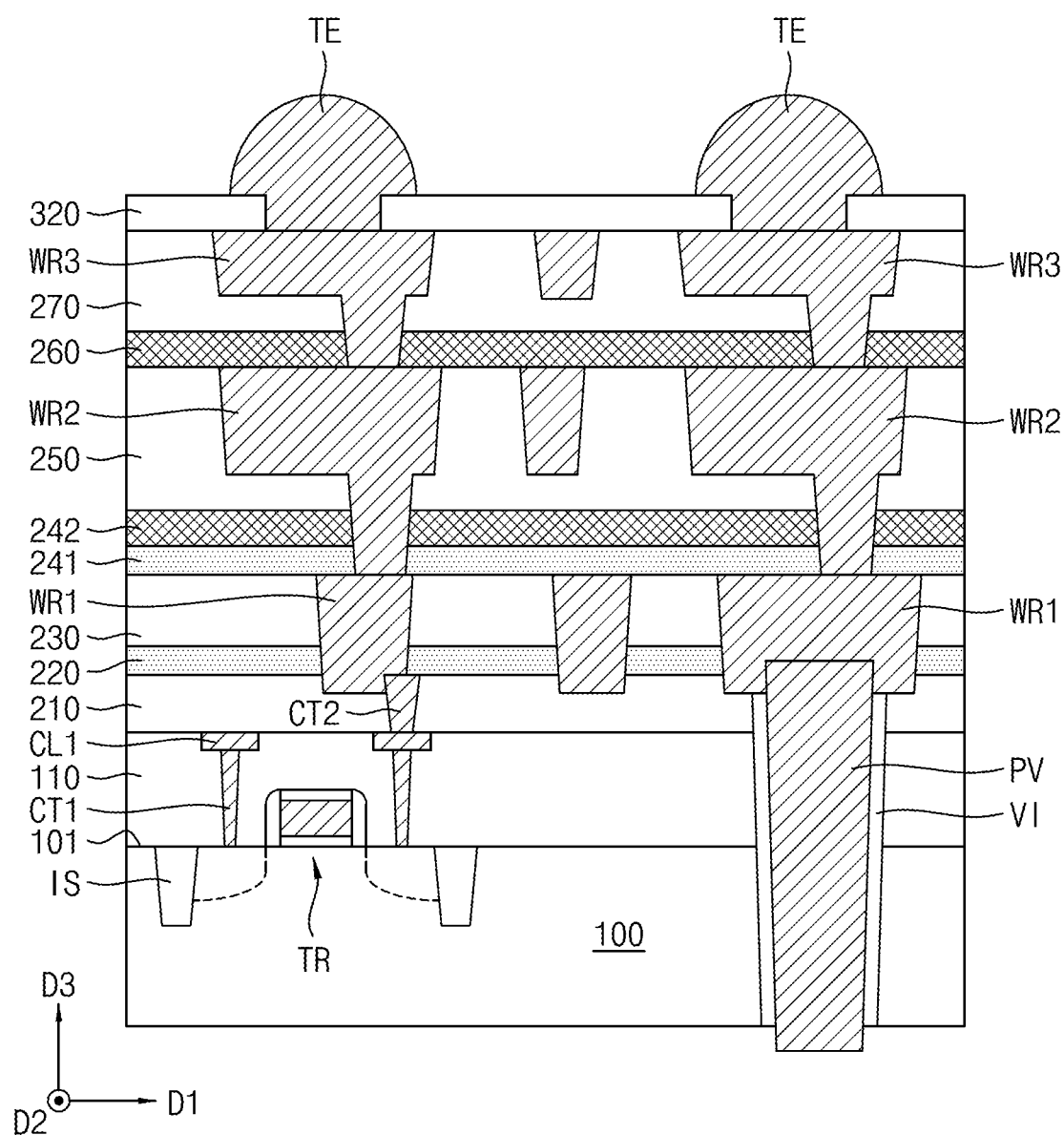

Referring to FIG. 3E, a back surface of the substrate 100 may be etched. The etched back surface of the substrate 100 may be defined as a second surface 102. As the back surface of the substrate 100 is etched, a portion of the penetrating via PV may be exposed.

Figure 3F:
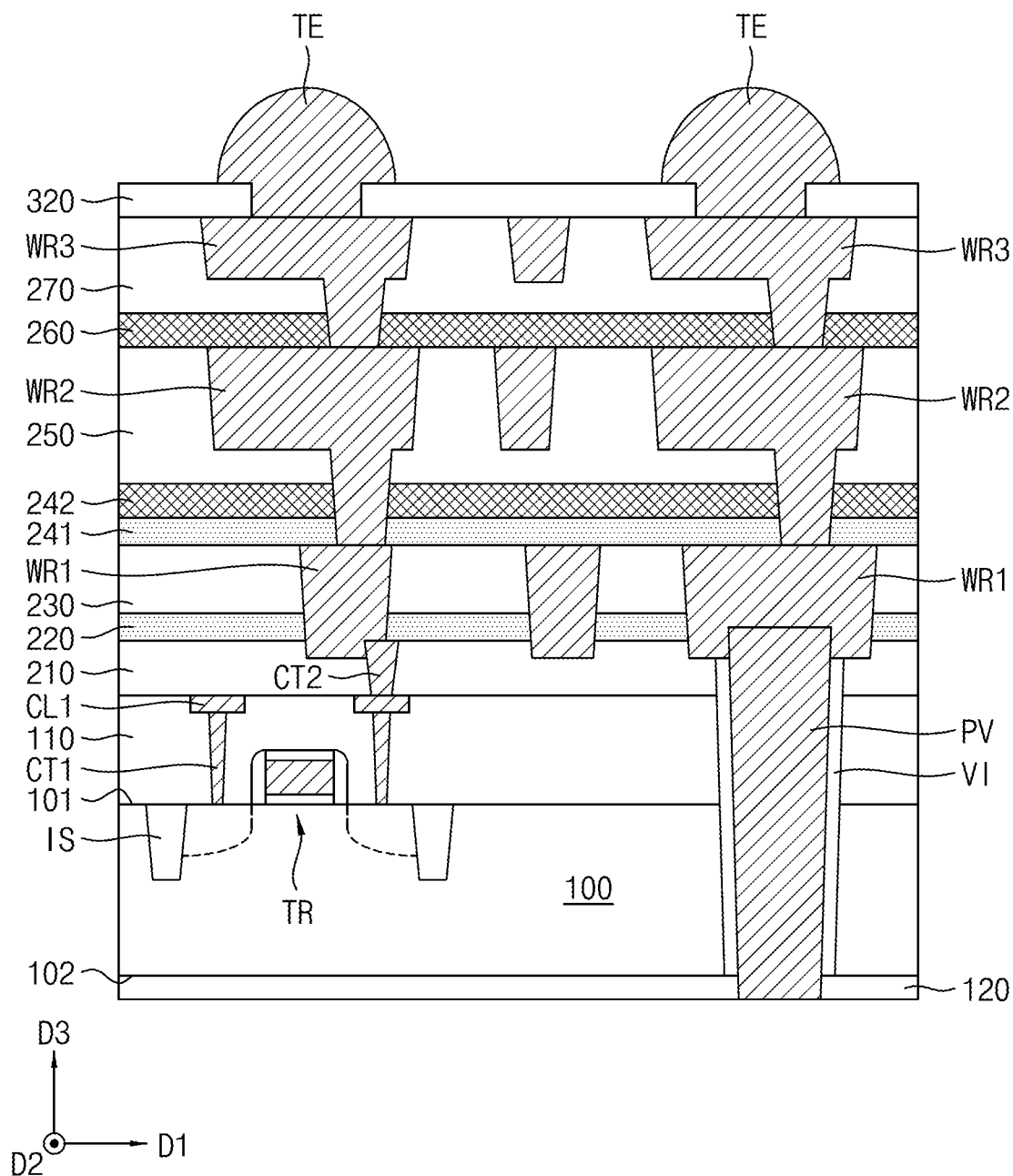

Referring to FIG. 3F, a second insulating layer 120 may be formed to be on and at least partially cover the second surface 102 of the substrate 100 and the exposed penetrating via PV. Subsequently, a portion of the second insulating layer 120 and a portion of the penetrating via PV may be removed to again expose the penetrating via PV.

Referring to FIG. 1, a first protective layer 310 at least partially covering a bottom surface of the second insulating layer 120 may be formed. A pad PD may be formed in the first protective layer 310.

Figure 4:
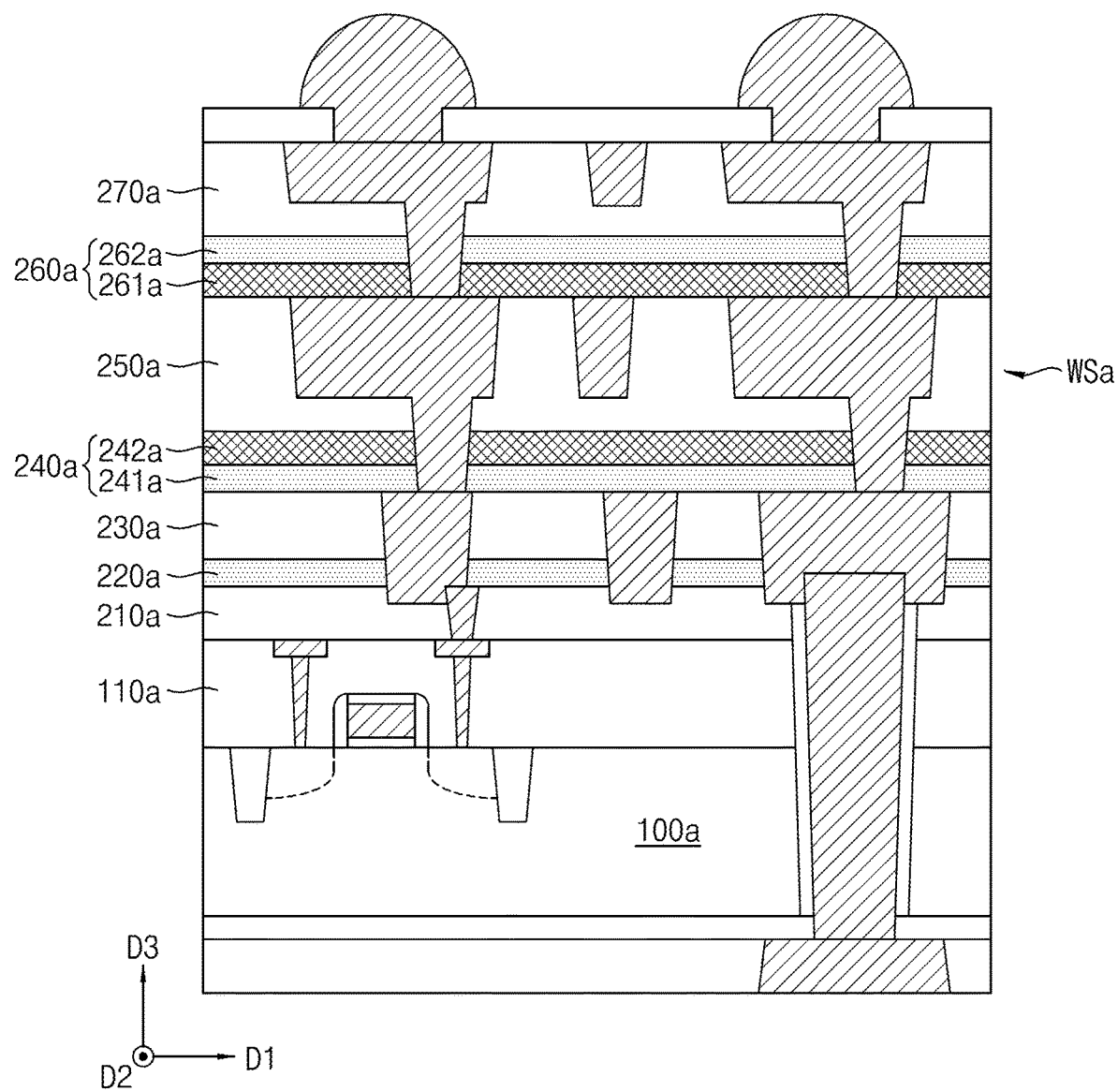
FIG. 4 is a sectional view of a semiconductor device according to some example embodiments of the disclosure.

FIG. 4 is a sectional view of a semiconductor device according to some example embodiments of the disclosure.

Referring to FIG. 4, the semiconductor device may include a substrate 100a, a first insulating layer 110a on the substrate 100a, and a wiring structure WSa on the first insulating layer 110a.

The wiring structure WSa may include first to fourth wiring insulating layers 210a, 230a, 250a, and 270a. The first to fourth wiring insulating layers 210a, 230a, 250a and 270a may include an insulating material including carbon and oxygen. The third wiring insulating layer 250a may include a low dielectric material. The carbon concentration of each of the first, second and fourth wiring insulating layers 210a, 230a, and 270a may be less than the carbon concentration of the third wiring insulating layer 250a. The first, second, and fourth wiring insulating layers 210a, 230a and 270a may have a greater dielectric constant than the third wiring insulating layer 250a. For example, the first, second, and fourth wiring insulating layers 210a, 230a and 270a may include TEOS, and the third wiring insulating layer 250a may include porous SiOCH.

The wiring structure WSa may include a single capping layer 220a between the first and second wiring insulating layers 210a and 230a, a first multi-capping layer 240a between the second and third wiring insulating layers 230a and 250a, and a second multi-capping layer 260a between the third and fourth wiring insulating layers 250a and 270a.

The single capping layer 220a may include an insulating material including nitrogen. For example, the single capping layer 220a may include SiN.

The first multi-capping layer 240a may include a first material layer 241a physically contacting the second wiring insulating layer 230a, and a second material layer 242a physically contacting the third wiring insulating layer 250a.

The first material layer 241a may include an insulating material including nitrogen, and the second material layer 242a may include an insulating material including nitrogen and carbon. For example, the first material layer 241a may include SiN, and the second material layer 242a may include SiCN.

The second multi-capping layer 260a may include a third material layer 261a physically contacting the third wiring insulating layer 250a, and a fourth material layer 262a physically contacting the fourth wiring insulating layer 270a. The third material layer 261a may include an insulating material including nitrogen and carbon, and the fourth material layer 262a may include an insulating material including nitrogen. For example, the third material layer 261a may include SiCN, and the fourth material layer 262a may include SiN.

Figure 5:
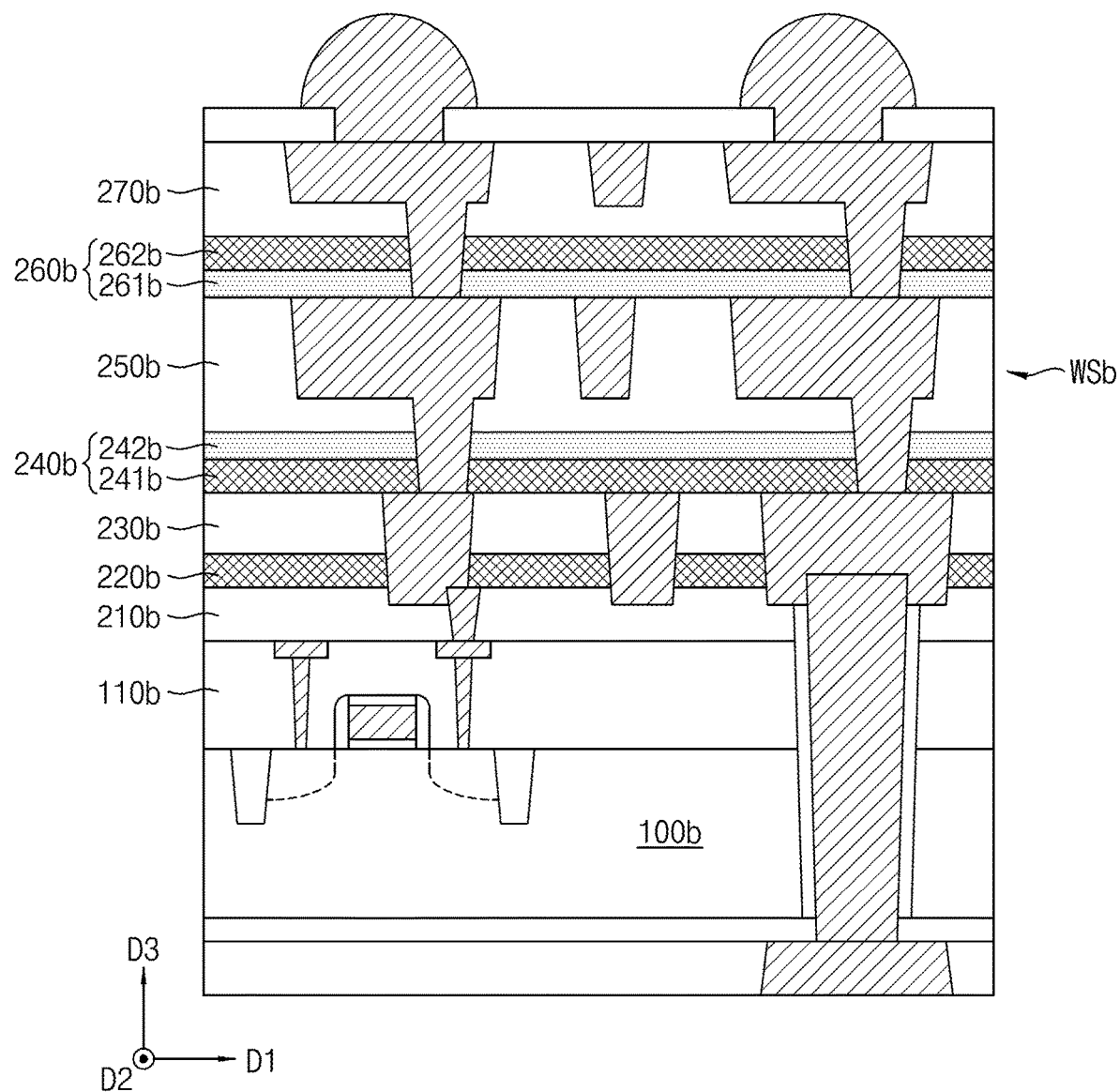
FIG. 5 is a sectional view of a semiconductor device according to some example embodiments of the disclosure.

FIG. 5 is a sectional view of a semiconductor device according to some example embodiments of the disclosure.

Referring to FIG. 5, the semiconductor device may include a substrate 100b, a first insulating layer 110b on the substrate 100b, and a wiring structure WSb on the first insulating layer 110b.

The wiring structure WSb may include first to fourth wiring insulating layers 210b, 230b, 250b, and 270b. The first to fourth wiring insulating layers 210b, 230b, 250b, and 270b may include an insulating material including carbon and oxygen. The first, second, and fourth wiring insulating layers 210b, 230b, and 270b may include a low dielectric material. The third wiring insulating layer 250b may have a higher dielectric constant than the first, second, and fourth wiring insulating layers 210b, 230b, and 270b. The carbon concentration of each of the first, second, and fourth wiring insulating layers 210b, 230b, and 270b may be greater than the carbon concentration of the third wiring insulating layer 250b. For example, the first, second, and fourth wiring insulating layers 210b, 230b, and 270b may include porous SiOCH, and the third wiring insulating layer 250b may include TEOS.

The wiring structure WSb may include a single capping layer 220b between the first and second wiring insulating layers 210b and 230b, a first multi-capping layer 240b between the second and third wiring insulating layers 230b and 250b, and a second multi-capping layer 260b between the third and fourth wiring insulating layers 250b and 270b.

The single capping layer 220b may include an insulating material including nitrogen and carbon. For example, the single capping layer 220b may include SiCN.

The first multi-capping layer 240b may include a first material layer 241b physically contacting the second wiring insulating layer 230b, and a second material layer 242b physically contacting the third wiring insulating layer 250b. The first material layer 241b may include an insulating material including nitrogen and carbon, and the second material layer 242b may include an insulating material including nitrogen. For example, the first material layer 241b may include SiCN, and the second material layer 242b may include SiN.

The second multi-capping layer 260b may include a third material layer 261b physically contacting the third wiring insulating layer 250b, and a fourth material layer 262b physically contacting the fourth wiring insulating layer 270b. The third material layer 261b may include an insulating material including nitrogen, and the fourth material layer 262b may include an insulating material including nitrogen and carbon. For example, the third material layer 261b may include SiN, and the fourth material layer 262b may include SiCN.

Figure 6:
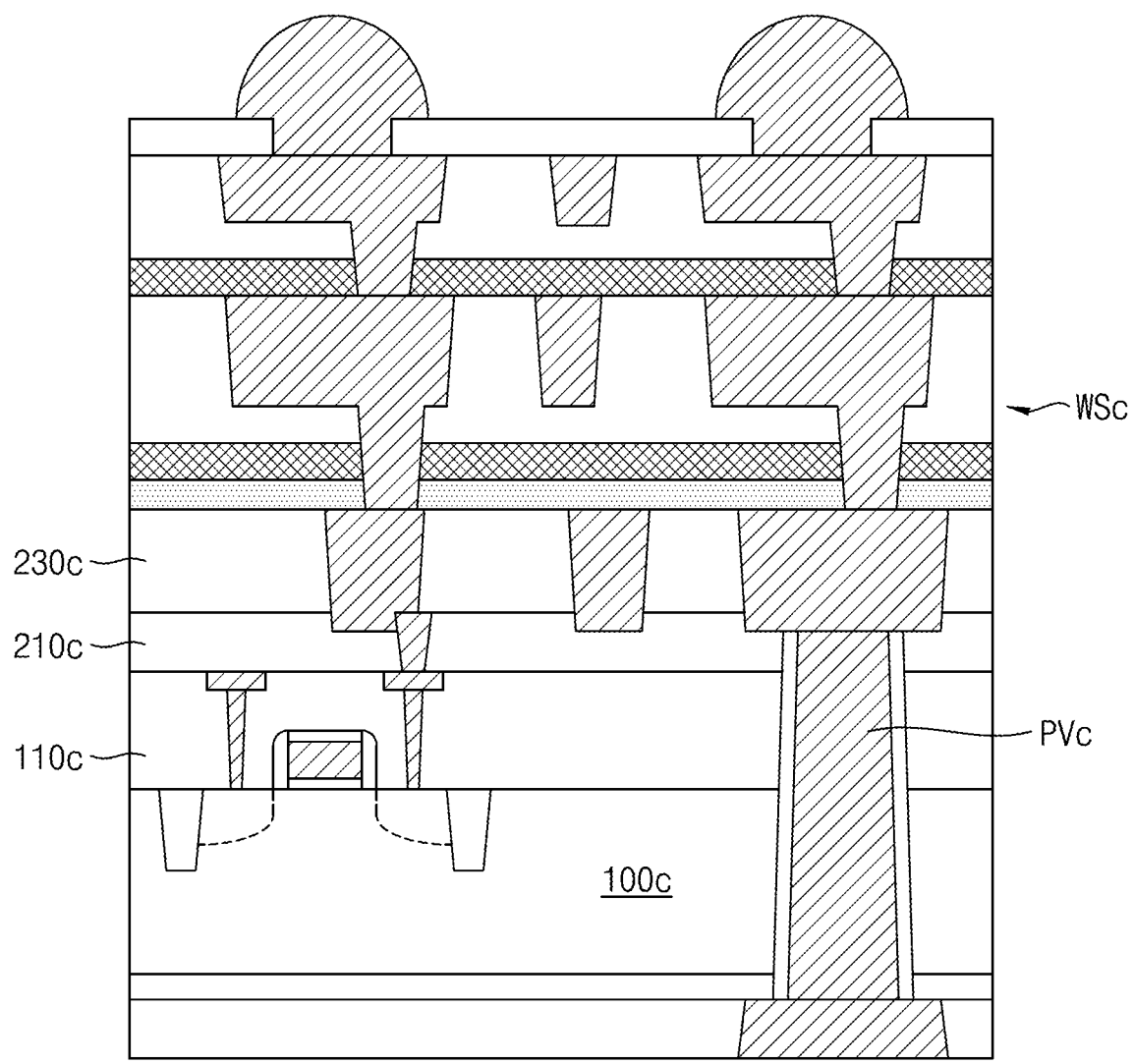
FIG. 6 is a sectional view of a semiconductor device according to some example embodiments of the disclosure.

FIG. 6 is a sectional view of a semiconductor device according to some example embodiments of the disclosure.

Referring to FIG. 6, the semiconductor device may include a substrate 100c, a first insulating layer 110c on the substrate 100c, and a wiring structure WSc on the first insulating layer 110c.

The semiconductor device may further include a penetrating via PVc. The width of the penetrating via PVc in a first direction D1 may be gradually reduced as the penetrating via PVc extends toward the wiring structure WSc. The penetrating via PVc may be formed at the side of a back surface of the substrate 100c.

The wiring structure WSc may include a first wiring insulating layer 210c physically contacting the first insulating layer 110c, and a second wiring insulating layer 230c physically contacting the first wiring insulating layer 210c. The first and second wiring insulating layers 210c and 230c may include an insulating material including carbon and oxygen.

Figure 7:
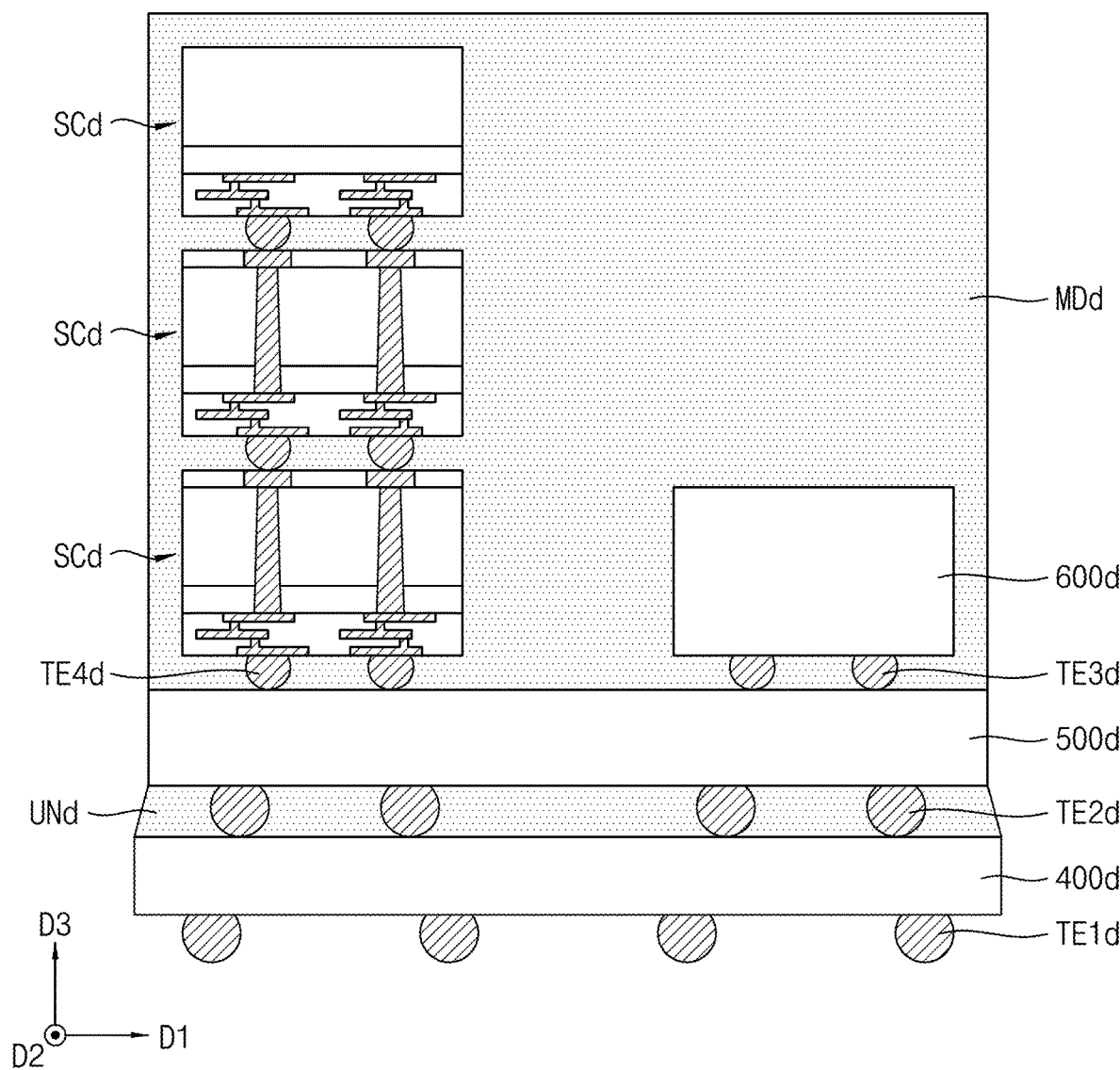
FIG. 7 is a sectional view of a semiconductor package according to some example embodiments of the disclosure.

FIG. 7 is a sectional view of a semiconductor package according to some example embodiments of the disclosure.

Referring to FIG. 7, the semiconductor package may include a package substrate 400d. For example, the package substrate 400d may be a printed circuit board (PCB). First terminals TE1d connected to the package substrate 400d may be provided.

An interposer 500d may be provided over the package substrate 400d in the cross-sectional view of FIG. 7. Second terminals TE2d interconnecting the package substrate 400d and the interposer 500d may be provided. An underfill layer UNd may be provided between the package substrate 400d and the interposer 500d.

A processor chip 600d may be provided over the interposer 500d in the cross-sectional view of FIG. 7. For example, the processor chip 600d may be a graphics processing unit (GPU) or a central processing unit (CPU). Third terminals TE3d interconnecting the processor chip 600d and the interposer 500d may be provided.

A plurality of semiconductor chips SCd arranged in in a third direction D3 may be provided over the interposer 500d in the cross-sectional view of FIG. 7. The semiconductor chips SCd may be spaced apart from the processor chip 600d in a first direction D1. Each of the semiconductor chips SCd may include a wiring structure. At least a part of the semiconductor chips SCd may include a penetrating via. Fourth terminals TE4d interconnecting the semiconductor chips SCd or interconnecting the semiconductor chip SCd and the interposer 500d may be provided.

A molding layer MDd at least partially surrounding the semiconductor chips SCd and the processor chip 600d, in plan and cross-sectional views of the semiconductor device, may be provided.

The semiconductor device according to the example embodiments of the disclosure may include a multi-capping layer including a plurality of material layers and, as such, reliability of the semiconductor device may be enhanced.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:
1. A semiconductor device comprising:
a substrate;

a transistor connected to the substrate; and
a wiring structure comprising contact wirings electrically connected to the transistor,
wherein the wiring structure further comprises a first wiring insulating layer, a first material layer contacting the first wiring insulating layer, a second material layer contacting the first material layer, and a second wiring insulating layer contacting the second material layer,
wherein the first material layer comprises SiN,
wherein the second material layer comprises SiCN,
wherein a dielectric constant of the first wiring insulating layer is greater than a dielectric constant of the second wiring insulating layer, and
wherein an interfacial fracture energy between the first wiring insulating layer and the first material layer is higher than an interfacial fracture energy between the first wiring insulating layer and the second material layer.

2. The semiconductor device according to claim 1, wherein a carbon concentration of the first wiring insulating layer is less than a carbon concentration of the second wiring insulating layer.

3. The semiconductor device according to claim 2, wherein:
the first wiring insulating layer comprises tetraethyl orthosilicate (TEOS); and
the second wiring insulating layer comprises porous SiOCH.

4. The semiconductor device according to claim 1, further comprising:
a penetrating via extending through the substrate,
wherein the wiring structure further comprises via wirings electrically connected to the penetrating via.

5. The semiconductor device according to claim 4, wherein:
the via wirings comprise a first via wiring contacting the penetrating via; and
a top surface of the first via wiring contacts a bottom surface of the first material layer.

6. The semiconductor device according to claim 5, wherein:
the contact wirings comprise a first contact wiring at a same level as the first via wiring relative to a top surface of the substrate being a base reference level; and
a top surface of the first contact wiring contacts the bottom surface of the first material layer.

7. The semiconductor device according to claim 5, wherein:
the via wirings comprise a second via wiring contacting the first via wiring; and
the second via wiring is at least partially surrounded by the second wiring insulating layer in a plan view of the semiconductor device.

8. A semiconductor device comprising:
a substrate;
an insulating layer on the substrate;
a transistor between the substrate and the insulating layer; and
a wiring structure on the insulating layer,
wherein the wiring structure comprises a first wiring insulating layer, a first material layer contacting the first wiring insulating layer, a second material layer contacting the first material layer, and a second wiring insulating layer contacting the second material layer,
wherein the first material layer comprises SiN,
wherein the second material layer comprises SiCN,
wherein the first and second wiring insulating layers comprise an insulating material comprising carbon and oxygen,
wherein a carbon concentration of the first wiring insulating layer is less than a carbon concentration of the second wiring insulating layer, and
wherein an interfacial fracture energy between the second wiring insulating layer and the second material layer is higher than an interfacial fracture energy between the second wiring insulating layer and the first material layer.

9. The semiconductor device according to claim 8, wherein:
the first wiring insulating layer comprises tetraethyl orthosilicate (TEOS); and
the second wiring insulating layer comprises porous SiOCH.

10. The semiconductor device according to claim 8, wherein:
the wiring structure further comprises a third material layer contacting the second wiring insulating layer; and
the third material layer comprises SiCN.

11. The semiconductor device according to claim 10, wherein:
the wiring structure further comprises a fourth material layer contacting the third material layer; and
the fourth material layer comprises SiN.

12. The semiconductor device according to claim 11, wherein:
the wiring structure further comprises a third wiring insulating layer contacting the fourth material layer; and
the third wiring insulating layer comprises a same material as the first wiring insulating layer.

13. The semiconductor device according to claim 8, wherein:
the wiring structure further comprises a single capping layer contacting the second wiring insulating layer, and a third wiring insulating layer contacting the single capping layer; and
the third wiring insulating layer comprises a same material as the second wiring insulating layer.

14. The semiconductor device according to claim 8, wherein:
the wiring structure further comprises a third material layer contacting the first wiring insulating layer; and
the third material layer comprises SiN.

15. The semiconductor device according to claim 14, wherein:
the wiring structure further comprises a fourth material layer contacting the third material layer; and
the fourth material layer comprises SiCN.

16. A semiconductor device comprising:
a substrate;
an insulating layer on the substrate;
a transistor between the substrate and the insulating layer; and
a wiring structure on the insulating layer,
wherein the wiring structure comprises a first wiring and a second wiring contacting each other, a first wiring insulating layer at least partially surrounding the first wiring in a plan view of the semiconductor device, a second wiring insulating layer at least partially surrounding the second wiring in the plan view of the semiconductor device, and a multi-capping layer interposed between the first and second wiring insulating layers, wherein a dielectric constant of the first wiring insulating layer is greater than a dielectric constant of the second wiring insulating layer, wherein the multi-capping layer comprises a first material layer and a second material layer respectively having different carbon concentrations, wherein an average of interfacial fracture energies at a plurality of positions between the first wiring insulating layer and the first material layer is higher than an average of interfacial fracture energies at a plurality of positions between the first wiring insulating layer and the second material layer, and wherein an average of interfacial fracture energies at a plurality of positions between the second wiring insulating layer and the second material layer is higher than an average of interfacial fracture energies at a plurality of positions between the second wiring insulating layer and the first material layer.

17. The semiconductor device according to claim 16, wherein:
the first wiring insulating layer contacts the first material layer;

the second wiring insulating layer contacts the second material layer; and a carbon concentration of the second material layer is greater than a carbon concentration of the first material layer.

18. The semiconductor device according to claim 17, wherein:
the first material layer comprises SiN; and
the second material layer comprises SiCN.

19. The semiconductor device according to claim 16, wherein:
the first and second wiring insulating layers comprise an insulating material comprising carbon and oxygen; and
a carbon concentration of the first wiring insulating layer is less than a carbon concentration of the second wiring insulating layer.

20. The semiconductor device according to claim 16, wherein the second wiring extends through the multi-capping layer.

* * * * *